(12) United States Patent
Lo

(10) Patent No.: US 8,916,957 B2
(45) Date of Patent: Dec. 23, 2014

(54) PACKAGE STRUCTURE AND PACKAGE PROCESS

(75) Inventor: Chi-Jang Lo, Hsin-Chu (TW)

(73) Assignee: Aptos Technology Inc., Hsin-Chu (TW)

( * ) Notice: Subject to any disclaimer, the term of this patent is extended or adjusted under 35 U.S.C. 154(b) by 588 days.

(21) Appl. No.: 13/186,488

(22) Filed: Jul. 20, 2011

(65) Prior Publication Data

US 2013/0020686 A1 Jan. 24, 2013

(51) Int. Cl.
*H01L 23/495* (2006.01)
*H01L 23/31* (2006.01)
*H01L 23/00* (2006.01)

(52) U.S. Cl.
CPC .... *H01L 23/49503* (2013.01); *H01L 23/49548* (2013.01); *H01L 23/3107* (2013.01); *H01L 24/08* (2013.01); *H01L 24/32* (2013.01); *H01L 24/48* (2013.01); *H01L 2224/32245* (2013.01); *H01L 2224/48247* (2013.01); *H01L 2224/08245* (2013.01)
USPC ............................. 257/676; 257/666; 257/787

(58) Field of Classification Search
USPC .......................................... 257/666, 676, 787
See application file for complete search history.

(56) References Cited

U.S. PATENT DOCUMENTS 7,339,258 B2 * 3/2008 Punzalan et al. .............. 257/666
2002/0186549 A1 12/2002 Bolken

FOREIGN PATENT DOCUMENTS

CN 1254952 5/2000
JP 5190748 7/1993

OTHER PUBLICATIONS

"Office Action of Taiwan Counterpart Application", issued on Sep. 3, 2014, p1-p11.

* cited by examiner

*Primary Examiner* — Roy Potter
(74) *Attorney, Agent, or Firm* — Jianq Chyun IP Office

(57) ABSTRACT

A package structure and a package process are provided. The package structure comprises a carrier having a carrying portion and a plurality of supporting bar remnants disposed around and extending outward from the carrying portion, a chip mounted to the carrying portion, and an encapsulant disposed on the carrier and covering the chip, wherein the supporting bar remnants are encapsulated by the encapsulant, and each of the supporting bar remnants has a distal end shrank from an outer surface of the encapsulant. A package process for fabricating the package structure is also provided.

11 Claims, 4 Drawing Sheets

PACKAGE STRUCTURE AND PACKAGE PROCESS

BACKGROUND OF THE INVENTION

1. Field of the Invention

The present invention relates to a package structure and a package process. More particularly, the present invention relates to a leadframe-based package structure and a package process.

2. Description of Related Art

Due to the great development of electronic circuit design, fabrication technology, and information science, the communication information can be digitalized, so that the communication information or other information can be easily stored in a semiconductor memory device and can be displayed or operated at, for example, a compute r system or any displaying terminal. In the current market, the memory device includes many different type of products, and the multimedia card is one of memory devices having widely application, due to its small size. For example, the multimedia card is adapted into the digital camera for store the image information.

Typically, memory cards comprise multiple integrated circuit devices or semiconductor dies. The dies are interconnected using a circuit board substrate which adds to the weight, thickness, stiffness and complexity of the card. Memory cards also include electrical contacts for providing an external interface to an insertion point or socket. These electrical contacts are typically disposed on the backside of the circuit board substrate with the electrical connection to the dies.

In an effort to simplify the process steps needed to fabricate the memory card, there has been developed by Applicant a memory card wherein a leadframe assembly is used as an alternative to the circuit board substrate. The leadframe and the semiconductor die of the memory card are covered with an encapsulant which hardens into a cover or body of the memory card. In the completed memory card, the contacts of the leadframe are exposed within a common surface of the body, with the die pad of the leadframe and the semiconductor die mounted thereto being disposed within or covered by the body.

The leadframe-based memory cards includes a plurality of supporting bars which are used to connect the contacts to the side rail of the leadframe are typically exposed in the leading edge of the memory card which is initially advanced into the host socket.

More particularly, exposed within this leading edge are the severed ends of the supporting bars created as a result of the cutting or singulation process typically used to separate the side rail of the leadframe from the remainder thereof subsequent to the formation of the body of the memory card. These exposed portions of the supporting bars give a potential to rust the metal features of the host socket, and are thus highly undesirable. Therefore, the novel structure or fabrication method for packaging the memory card is still in need.

SUMMARY OF THE INVENTION

Accordingly, the present invention is directed to a package structure wherein the supporting bars are not protruding from the outer surface of the encapsulant.

The present invention is directed to a package process for fabricating a package structure wherein the supporting bars are not protruding from the outer surface of the encapsulant.

The present invention provides a package structure comprising a carrier having a carrying portion and a plurality of supporting bar remnants disposed around and extending outward from the carrying portion, a chip mounted to the carrying portion, and an encapsulant disposed on the carrier and covering the chip, wherein the supporting bar remnants are encapsulated by the encapsulant, and each of the supporting bar remnants has a distal end shrunk from an outer surface of the encapsulant.

The present invention further provides a package structure comprising a carrier having a carrying portion and a plurality of supporting bar remnants disposed around and extending outward from the carrying portion, a chip mounted to the carrying portion, and an encapsulant disposed on the carrier and covering the chip, wherein the supporting bar remnants are encapsulated by the encapsulant, and each of the supporting bar remnants has a distal end shrunk from an outer surface of the encapsulant.

The present invention also provides a package process comprising providing a carrier, wherein the carrier comprises a carrying portion, a side rail surrounding the carrying portion, and a plurality of supporting bars, each of the supporting bars connecting the carrying portion to the side rail and having a notch, mounting a chip to the carrying portion of the carrier, forming an encapsulant on the carrier to cover the chip and encapsulate an inner portion of each of the supporting bars and the notch located on the inner portion, an outer portion of each of the supporting bars being exposed by the encapsulant, applying a tensile force to the outer portion of each of the supporting bars to form a breaking point on the notch of each of the supporting bars, and removing the side rail from the breaking point of each of the supporting bars, wherein a plurality of supporting bar remnants remain in the encapsulant, and each of the supporting bar remnants has a distal end shrunk from an outer surface of the encapsulant.

According to an embodiment of the present invention, a transverse width of each of the supporting bar remnants described above is shrunk at the distal end.

According to an embodiment of the present invention, the chip described above comprises a flash memory.

According to an embodiment of the present invention, the carrying portion described above comprises a plurality of leads electrically connected to the chip and exposed on a bottom surface of the encapsulant.

According to an embodiment of the present invention, the encapsulant has a plurality of holes on the outer surface of the encapsulant for respectively exposing the distal ends of the supporting bar remnants.

According to an embodiment of the present invention, the distal end of each of the supporting bar remnants described above shrunk from the outer surface of the encapsulant in a distance between 0 mm and 2 mm.

According to an embodiment of the present invention, the chip described above is mounted to the carrying portion by surface mounting technique (SMT) or wire bonding technique.

According to an embodiment of the present invention, each of the supporting bars described above has an outer portion exposed by the encapsulant, and the notch of each of the supporting bars is separated from the outer portion in a distance, the distance being D1:

$$D1 = C + D; \text{ and}$$

$$C = \sqrt{[(k*A)^2 + (k*B)^2]},$$

wherein C is an elongation of each of the supporting bars, A is a width of each of the supporting bars, B is a thickness of each of the supporting bars, k is a design factor, and D is a tolerance factor.

According to an embodiment of the present invention, C=m*(A/B), and m is between 0.25 and 0.33.

According to an embodiment of the present invention, each of the supporting bars described above has an outer portion exposed by the encapsulant, and the notch of each of the supporting bars described above is separated from the outer portion in a distance between 0 mm and 2 mm.

According to an embodiment of the present invention, the tensile force described above is applied by using a fixture.

According to an embodiment of the present invention, the fixture described above comprises a clamping part clamping the outer portion of each of the supporting bars, and a carrying part carrying the carrier and provided with a supporting portion located between the clamping part and the encapsulant for supporting the outer portions adjacent to the encapsulant, wherein the clamping part is adapted to move in relative to the carrying part to generate the tensile force applied on each of the supporting bars.

In the package structure and the package process of the present invention, each of the supporting bars comprises a notch inside the encapsulant. A tensile force is applied to each of the supporting bars of the package structure, the supporting bars thus break at the notches inside the encapsulant. Thereby, the package structure can easily be singularized without any cutting tools. The package process is faster and simpler and the efficiency of package process thus can be improved.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention.

DESCRIPTION OF THE EMBODIMENTS

Figure 1:
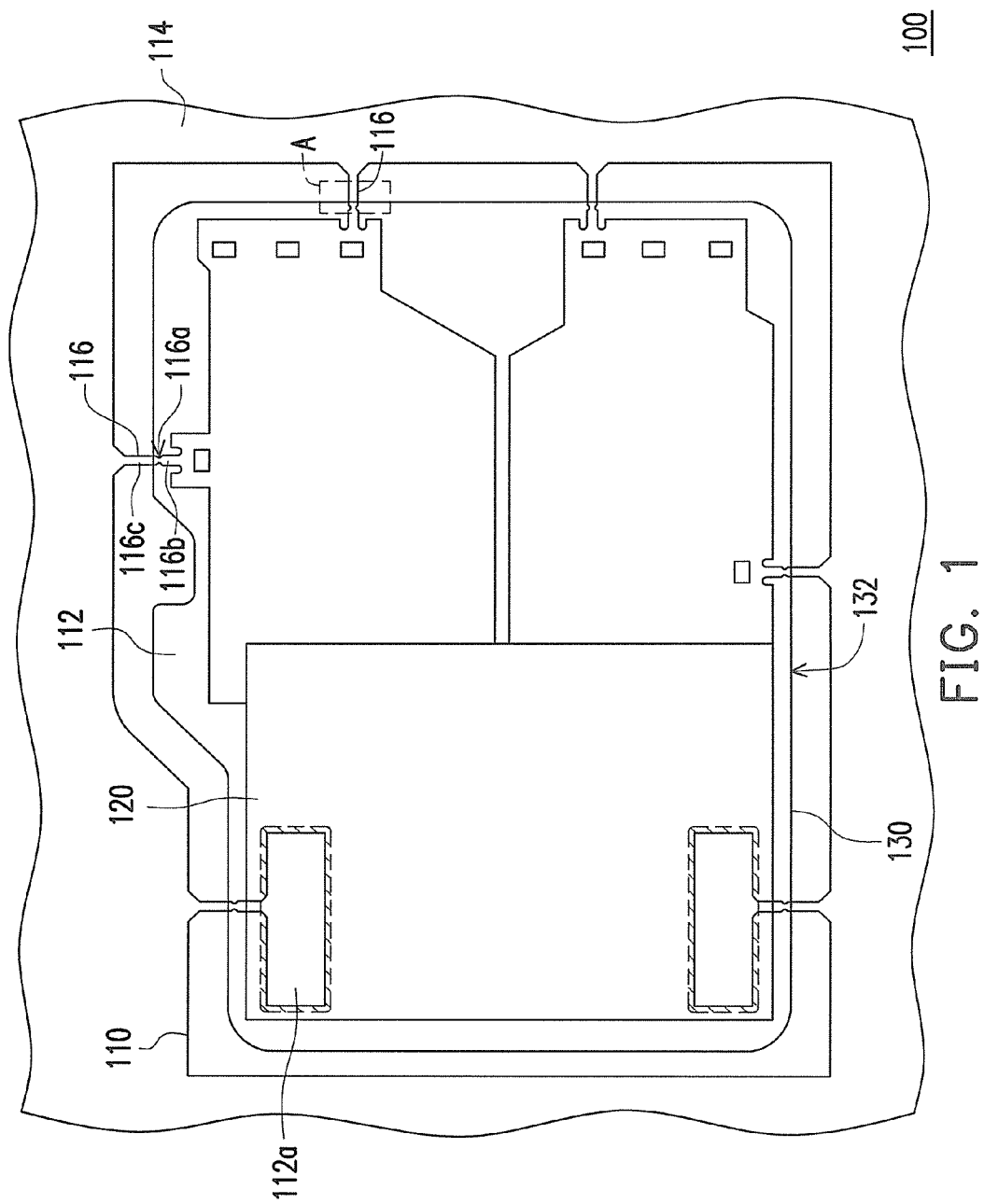
FIG. 1 illustrates the package structure according to an embodiment of the invention.

Reference will now be made in detail to the present preferred embodiments of the invention, examples of which are illustrated in the accompanying drawings. Wherever possible, the same reference numbers are used in the drawings and the description to refer to the same or like parts.

Figure 2:
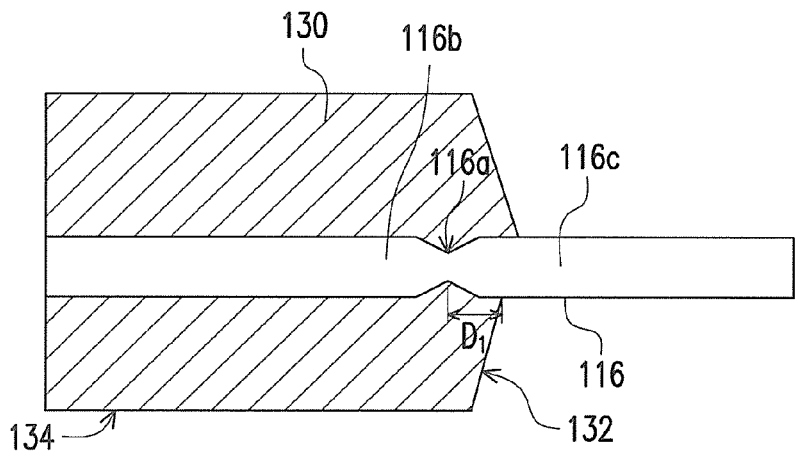
FIG. 2 illustrates an cross-sectional view of a part of the region A of FIG. 1.

The present embodiment is used for illustrating the package structures and the package process which the present invention provides. FIG. 1 illustrates the package structure according to an embodiment of the invention. FIG. 2 illustrates a cross-sectional view of a part of the region A of FIG. 1. As shown in FIG. 1 and FIG. 2, one embodiment of the package structure 100 comprises a carrier 110, a chip 120 and an encapsulant 130. For better illustration, the encapsulant 130 in FIG. 1 is shown perspectively. In the present embodiment, the chip 120 comprises a flash memory, and the package structure 100 is a memory card. The memory card may have alternative memory card formats, including those of secure digital cards (SDC), compact flash (CF), smart media, memory stick, and other small form factor memory cards. The carrier 110 comprises a carrying portion 112, a side rail 114 surrounding the carrying portion 112, and a plurality of supporting bars 116. In the present embodiment, the carrier 120 is a leadframe. The carrying portion 112 comprises a plurality of leads 112a electrically connected to the chip 120 and exposed on a bottom surface 134 of the encapsulant 130.

Each of the supporting bars 116 connects the carrying portion 112 to the side rail 114 and has a notch 116a. The notch 116a can be made by cutting, etching, etc.

The chip 120 is mounted to the carrying portion 112, wherein the mounting method can be vary, for example, surface mounting technique (SMT), wire bonding technique, etc. Also, in other embodiment of the package structure, a plurality of chips can be mounted The encapsulant 130 disposed on the carrier 110 and covering the chip 120, wherein each of the supporting bars 116 has an inner portion 116b encapsulated by the encapsulant 130, an outer portion 116c exposed by the encapsulant 130. The notch 116a of each of the supporting bars 116 is located on the inner portion 116b, and is separated from the outer portion 116c with a distance D1 between 0 mm and 2 mm.

Figure 3:
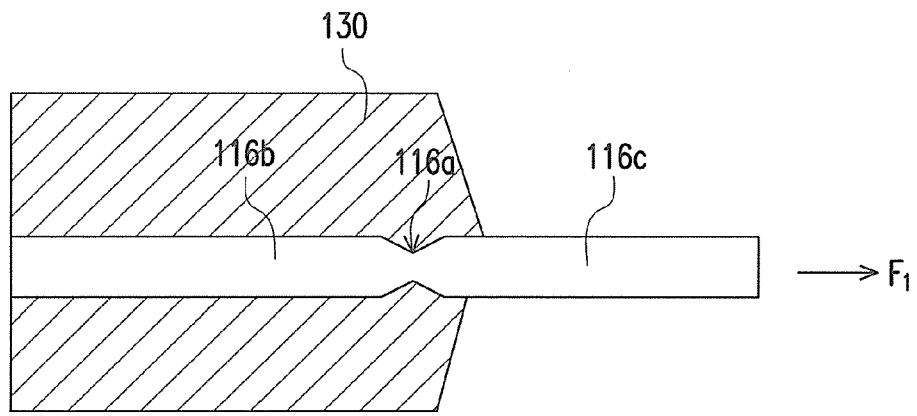
FIG. 3 illustrates an tensile force applied to the supporting bar of FIG. 2.
Figure 4:
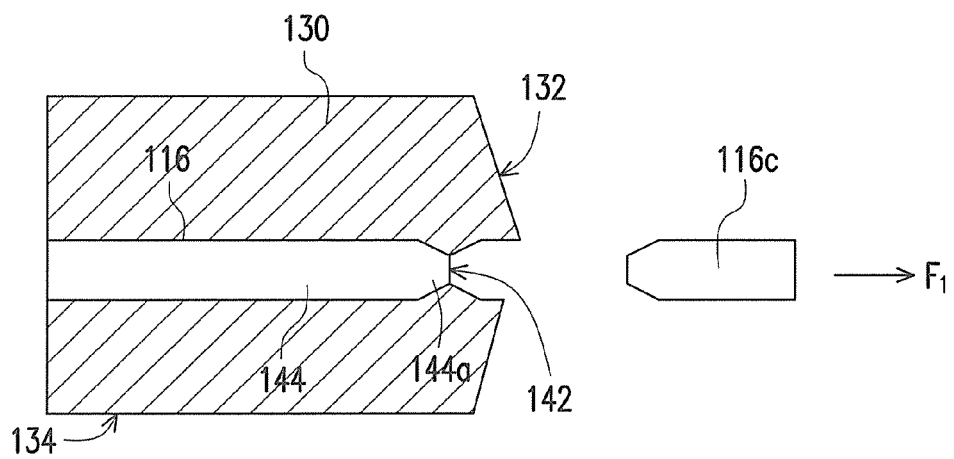
FIG. 4 illustrates the tensile force Ruining a breaking point on the notch of the supporting bar of FIG. 2.

To disconnect the carrying portion 112 from the side rail 114 for singularizing the package structure 100, a singulation operation is applied to the package structure 100. FIG. 3 illustrates a tensile force applied to the supporting bar of FIG. 2. FIG. 4 illustrates the tensile force forming a breaking point on the notch of the supporting bar of FIG. 2. As shown in FIG. 3 and FIG. 4, one embodiment of the package process provided by the present invention comprises applying a tensile force Fl, for example, a horizontal force, along a longitudinal direction of the supporting bar 116 to each of the outer portion 116c to form a breaking point 142 on of the notch 116a of each of the supporting bars.

The tensile force F1 can be applied by a fixture, wherein the fixture can comprises a clamping part for clamping the outer portion 116c of each of the supporting bars 116, and a carrying part carrying the carrier 110 and provided with a supporting portion located between the clamping part and the encapsulant 130 for supporting the outer portions 116c adjacent to the encapsulant 130 in a horizontal plane. The clamping part is adapted to move in relative to the carrying part to generate the tensile force F1 applied on each of the supporting bars 116.

By applying the tensile force F1, each of the supporting bar 116 breaks at the breaking point 142 due to the notch 116a on the supporting bar 116. The side rail 114 is removed from the breaking point 142 of each of the supporting bars 116 to finish the singulation process. A plurality of supporting bar remnants 144 remain in the encapsulant 130, and each of the supporting bar remnants 144 has a distal end 144a shrunk from an outer surface 132 of the encapsulant 130. The encapsulant 130 thus has a plurality of holes 136 on the outer surface 132 of the encapsulant 130 for respectively exposing the distal ends 144a of the supporting bar remnants 144. Also, a transverse width of each of the supporting bar remnants 144 is shrunk at the distal end 144a because each of the distal end 144a is formed due to the supporting bar 116 breaking at the notch 116a.

Figure 5:
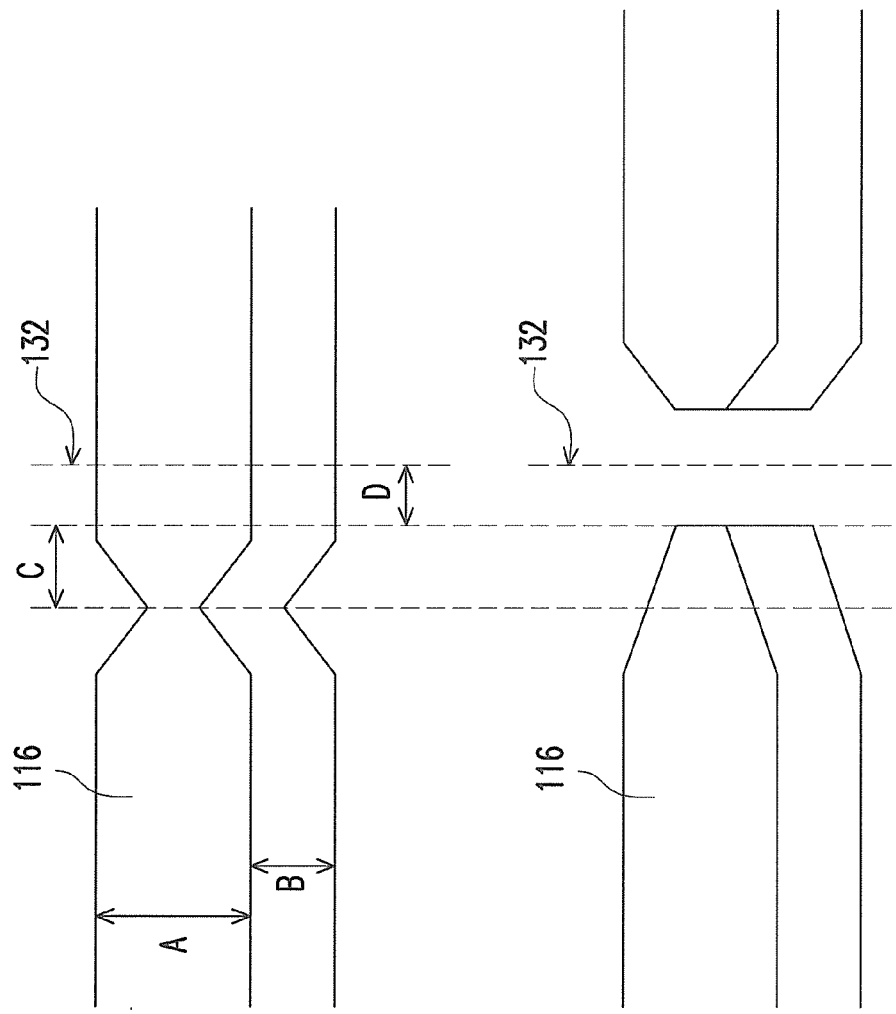
FIG. 5 illustrates the distance between the notch and the outer surface of the encapsulant.

FIG. 5 illustrates the distance between the notch and the outer surface of the encapsulant. Please refer to both FIG. 2 and FIG. 5, the present invention limits the range of the distance D1 between the notch 116a and the outer surface 132 of the encapsulant 130 from 0 mm to 2 mm, and the distance D1 can also be obtained by the formulas listed as follow:

$$D1 = C + D;$$

$$C = \sqrt{[(k*A)^2 + (k*B)^2]} \text{ and}$$

wherein
  A is a width of each of the supporting bars,
  B is a thickness of each of the supporting bars,
  C is an elongation of each of the supporting bars,
  D is a tolerance factor, and
  k is a design factor.

The tolerance factor D can be the safety factor considering the deviation caused during fabrication, in the ideal situation, the tolerance factor D can be zero, which means the distal ends 144a at the same surface with the outer surface 132 of the encapsulant 130. The design factor k can be associate with the coefficient of extension of the supporting bars. Experientially, the value of C falls in a range of m*(A/B), wherein m=0.2~0.33.

Figure 6:
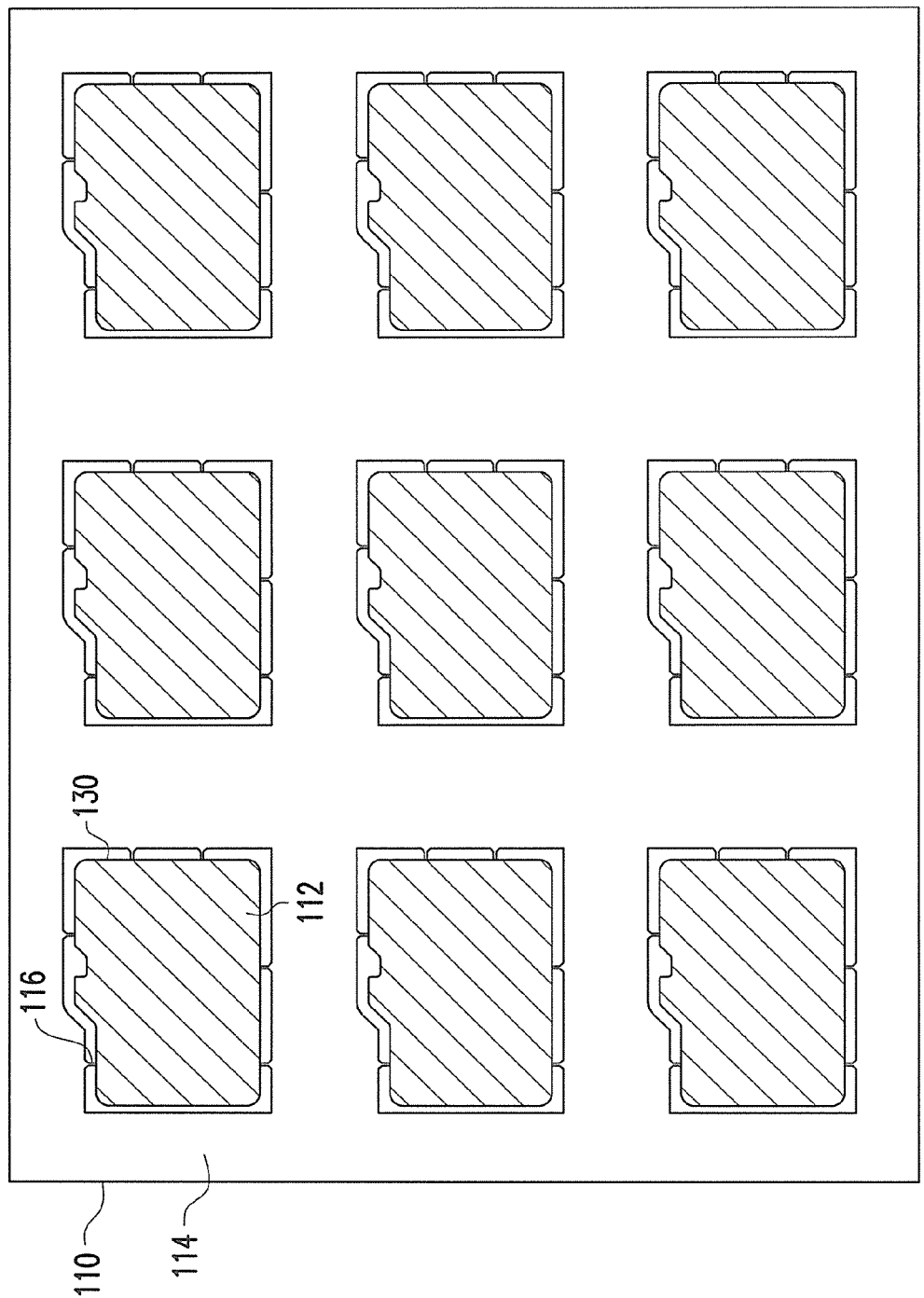
FIG. 6 illustrates the package structure according to another embodiment of the invention.

FIG. 6 illustrates the package structure according to another embodiment of the invention. As shown in FIG. 6, in another embodiment of the present invention, the package structure 100 comprises a carrier 110, a plurality of chips 120, and a plurality of encapsulants 130. Due to duplicates, the elements covered by encapsulants 130 are not show in FIG. 6. Please refer to FIG. 1 for the detail illustration. The carrier 110 comprises a plurality of carrying portion 112, a plurality of side rails 114 surrounding the corresponding carrying portions 112, and a plurality of supporting bars 116 connecting the carrying portions 112 to the side rails 114. A plurality of chips are mounted respectively to the carrying portions 112, and a plurality of encapsulants 130 disposed on the carrier 110 and covering the chips 120. When the singulation process is applied, which means a tensile force is applied along a longitudinal direction of each of the supporting bars 116 as the previous embodiment described, the carrying portions 112 are separated from the side rails 114, and the singulation process of the package structure 100 is done.

As the disposition described above, when a tensile force is applied to each of the supporting bars of the package structure, the supporting bars break at the notches thereof inside the encapsulant. Therefore, the undesirable supporting bars remnants exposed outside the encapsulant can be avoided. Also, the singulation process of the package structure can be done without any cutting tools by applying a tensile force to the supporting bars, for example, punch. According to the spirit of the present invention, the present invention simplifies the package process and improves the efficiency thereof.

It will be apparent to those skilled in the art that various modifications and variations can be made to the structure of the present invention without departing from the scope or spirit of the invention. In view of the foregoing, it is intended that the present invention cover modifications and variations of this invention provided they fall within the scope of the following claims and their equivalents.

What is claimed is:

1. A package structure, comprising:
  a carrier having a carrying portion and a plurality of supporting bar remnants disposed around and extending outward from the carrying portion;
  a chip mounted to the carrying portion; and
  an encapsulant disposed on the carrier and covering the chip, wherein the supporting bar remnants are encapsulated by the encapsulant, and each of the supporting bar remnants has a distal end shrunk from an outer surface of the encapsulant.

2. The package structure as claimed in claim 1, wherein a transverse width of each of the supporting bar remnants is shrunk at the distal end.

3. The package structure as claimed in claim 1, wherein the chip comprises a flash memory.

4. The package structure as claimed in claim 1, wherein the carrying portion comprises a plurality of leads electrically connected to the chip and exposed on a bottom surface of the encapsulant.

5. The package structure as claimed in claim 1, wherein the encapsulant has a plurality of holes on the outer surface of the encapsulant for respectively exposing the distal ends of the supporting bar remnants.

6. The package structure as claimed in claim 1, wherein the distal end of each of the supporting bar remnants shrunk from the outer surface of the encapsulant in a distance between 0 mm and 2 mm.

7. A package structure, comprising:
  a carrier comprising:
    a carrying portion;
    a side rail surrounding the carrying portion; and
    a plurality of supporting bars, each of the supporting bars connecting the carrying portion to the side rail and having a notch;
  a chip mounted to the carrying portion; and
  an encapsulant disposed on the carrier and covering the chip, wherein each of the supporting bars has an inner portion and an outer portion, the inner portion is encapsulated by the encapsulant, the outer portion is exposed by the encapsulant, and the notch of each of the supporting bars is located on the inner portion and separated from the outer portion in a distance between 0 mm and 2 mm.

8. The package structure as claimed in claim 7, wherein the chip comprises a flash memory.

9. The package structure as claimed in claim 7, wherein the carrying portion comprises a plurality of leads electrically connected to the chip and exposed on a bottom surface of the encapsulant.

10. The package structure as claimed in claim 7, wherein each of the supporting bars has an outer portion exposed by the encapsulant, and the notch of each of the supporting bars is separated from the outer portion in a distance, the distance being D1:

$$D1 = C + D; \text{ and}$$

$$C = \sqrt{[(k*A)^2 + (k*B)^2]},$$

wherein C is an elongation of each of the supporting bars, A is a width of each of the supporting bars, B is a thickness of each of the supporting bars, k is a design factor, and D is a tolerance factor.

11. The package structure as claimed in claim 10, wherein C=m*(A/B), and m is between 0.25 and 0.33.

* * * * *